United States Patent
Wang et al.

(10) Patent No.: US 10,117,024 B1
(45) Date of Patent: Oct. 30, 2018

(54) AUDIO PROCESSING DEVICE AND METHOD

(71) Applicant: Realtek Semiconductor Corporation, Hsinchu (TW)

(72) Inventors: Yi-Huan Wang, Hsinchu County (TW); Jin-Rong Chen, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/961,904

(22) Filed: Apr. 25, 2018

(30) Foreign Application Priority Data

Apr. 26, 2017 (TW) .............................. 106113991 A

(51) Int. Cl.
| | |
|---|---|
| H04R 5/00 | (2006.01) |
| H04R 5/04 | (2006.01) |
| G10L 17/06 | (2013.01) |
| H03M 1/12 | (2006.01) |
| H04S 1/00 | (2006.01) |

(52) U.S. Cl.
CPC ............... H04R 5/04 (2013.01); G10L 17/06 (2013.01); H03M 1/12 (2013.01); H04S 1/007 (2013.01)

(58) Field of Classification Search
CPC ....................................................... H04R 5/00
See application file for complete search history.

(56) References Cited

U.S. PATENT DOCUMENTS

| 7,230,557 B1 * | 6/2007 | Burk | G06F 3/162 |
| | | | 341/141 |
| 9,882,575 B1 * | 1/2018 | Li | H03M 1/468 |
| 2007/0164891 A1 * | 7/2007 | Sutardja | H03M 1/145 |
| | | | 341/161 |
| 2010/0176980 A1 * | 7/2010 | Breitschadel | H03M 1/188 |
| | | | 341/155 |
| 2013/0141262 A1 * | 6/2013 | Hays | G01F 1/8431 |
| | | | 341/118 |
| 2015/0188556 A1 * | 7/2015 | Chen | H03M 1/188 |
| | | | 341/153 |

* cited by examiner

*Primary Examiner* — Olisa Anwah
(74) *Attorney, Agent, or Firm* — CKC & Partners Co., Ltd.

(57) ABSTRACT

An audio processing device that includes a first ADC, a second ADC, a register and a processing circuit is provided. The processing circuit executes a first audio application program corresponding to a first analog input audio stream and assigns the first analog input audio stream to the first ADC. When the processing circuit identifies that a second audio application program also corresponds to the first analog input audio stream, the processing circuit control the first ADC to process the first analog input audio stream. When second audio application program corresponds to a second analog input audio stream, the processing circuit assigns the second analog input audio stream to the second ADC for processing such that the first and the second ADCs process the first and the second analog input audio stream respectively.

14 Claims, 3 Drawing Sheets

AUDIO PROCESSING DEVICE AND METHOD

RELATED APPLICATIONS

This application claims priority to Taiwan Application Serial Number 106113991, filed Apr. 26, 2017, which is herein incorporated by reference.

BACKGROUND

Field of Disclosure

The present disclosure relates to an audio processing technology. More particularly, the present disclosure relates to an audio processing device and an audio processing method of the same.

Description of Related Art

When an audio signal is processed, an analog-to-digital converter (ADC) is required to covert the audio signal from an analog form to a digital form.

In some usage scenarios, the audio processing device receives a plurality of audio streams corresponding to different audio application programs simultaneously. However, the input audio streams with respect to different audio application programs may be received from the same audio source. For example, an audio recognition and control software and a recording software may process the audio from a single microphone simultaneously. In such circumstance, assigning input audio streams from the same microphone to different ADCs by the audio processing device results in a waste of hardware resource.

Accordingly, what is needed is an audio processing device and an audio processing method to address the issues mentioned above.

SUMMARY

An aspect of the present disclosure is to provide an audio processing device that includes a first analog-to-digital converter (ADC), a second ADC, a register and a processing circuit. The processing circuit is configured to execute a first audio application program corresponding to a first analog input audio stream, identify that the first analog input audio stream is from an audio source and assign the first analog input audio stream to the first ADC. When the processing circuit executes a second audio application program and identifies that the second audio application program also corresponds to the first analog input audio stream, the processing circuit is configured to control the first ADC to process the first analog input audio stream that corresponds to both the second audio application program and the first audio application program. When the second audio application program corresponds to a second analog input audio stream that is not generated from the audio source, the processing circuit is configured to assign the second analog input audio stream to the second ADC for processing, such that the first ADC processes the first analog input audio stream and the second ADC processes the second analog input audio stream.

Another aspect of the present disclosure is to provide an audio processing method used in an audio processing device that includes the steps outlined below. A first audio application program corresponding to a first analog input audio stream is executed by a processing circuit, the first analog input audio stream is from an audio source is identified by a processing circuit, and the first analog input audio stream is assigned to a first ADC. A second audio application program is executed and whether the second audio application program also corresponds to the first analog input audio stream is identified by the processing circuit. When the second audio application program also corresponds to the first analog input audio stream, the first ADC is controlled to process the first analog input audio stream that corresponds to both the second audio application program and the first audio application program. When the second audio application program corresponds to a second analog input audio stream that is not generated from the audio source, the second analog input audio stream is assigned to the second ADC for processing by the processing circuit such that the first ADC processes the first analog input audio stream and the second ADC processes the second analog input audio stream.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
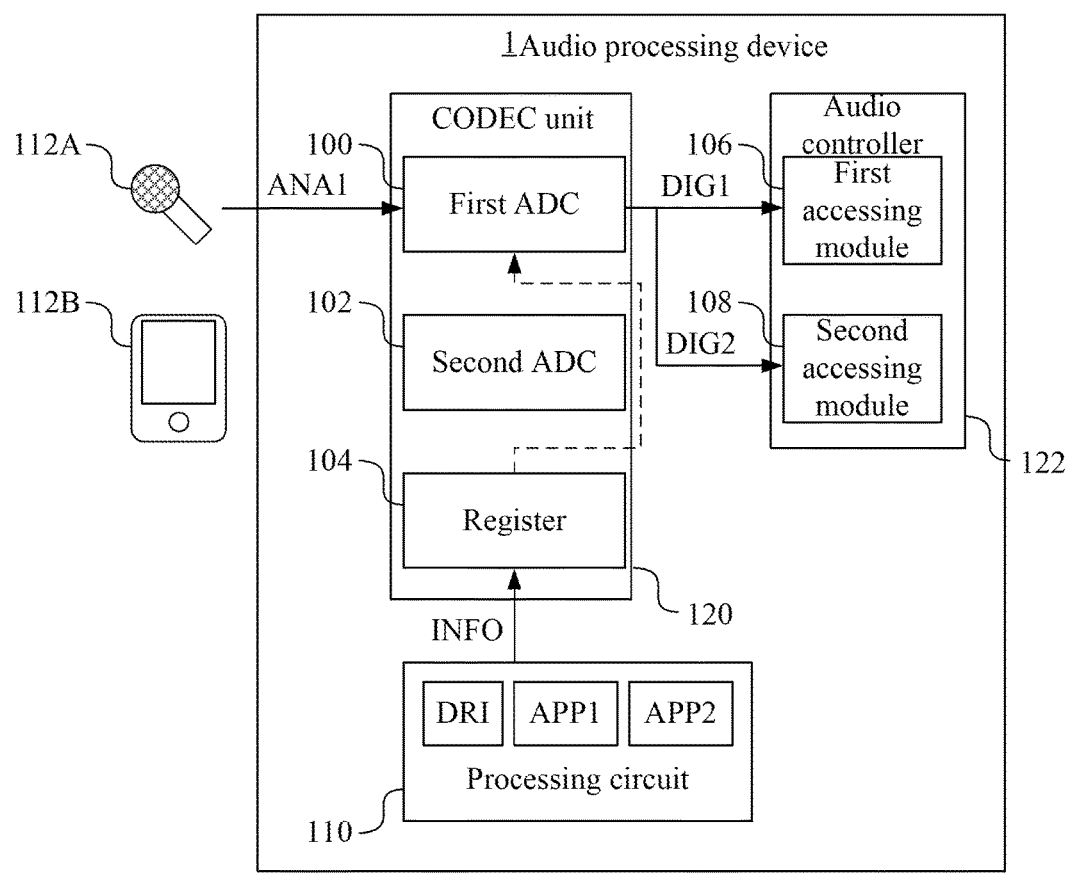
FIG. 1A and FIG. 1B are block diagrams of an audio processing device under different operation scenarios in an embodiment of the present invention.
Figure 1B:
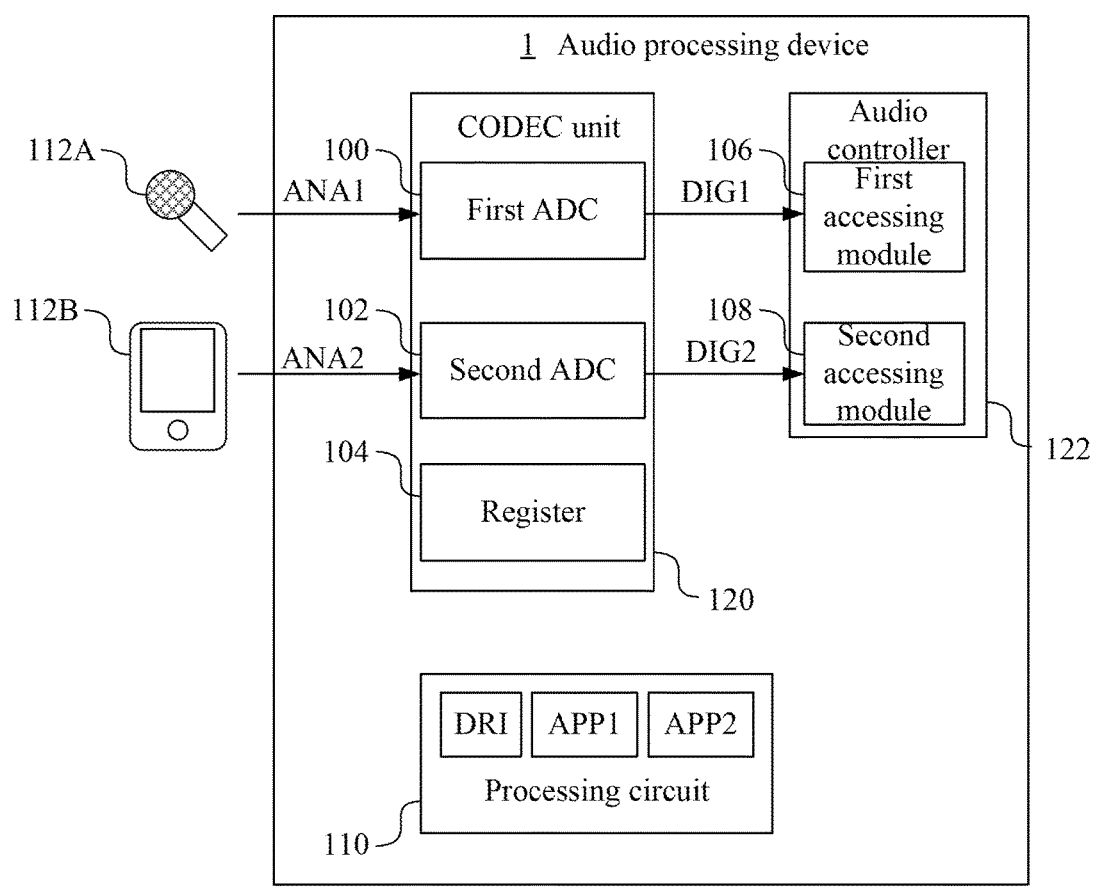

Reference is now made to FIG. 1A and FIG. 1B. FIG. 1A and FIG. 1B are block diagrams of an audio processing device 1 under different operation scenarios in an embodiment of the present invention.

The audio processing device 1 includes a first ADC 100, a second ADC 102, a register 104, a first accessing module 106, a second accessing module 108 and a processing circuit 110.

In an embodiment, the audio processing device 1 is disposed in a computer system (not illustrated). The first ADC 100, the second ADC 102, the register 104, the first accessing module 106 and the second accessing module 108 can be disposed in such as, but not limited to an audio processing chip (not illustrated) in the computer system.

In an embodiment, the first ADC 100, the second ADC 102 and the register 104 can be disposed in such as, but not limited to a coder-decoder (CODEC) unit 120 of the audio processing chip.

The first accessing module 106 and the second accessing module 108 can be disposed in such as, but not limited to an audio controller 122 of the audio processing chip. In an embodiment, each of the first accessing module 106 and the second accessing module 108 is a direct memory access (DMA) module.

The processing circuit 110 can be such as, but not limited to a central processing unit of the computer system. The processing circuit 110 is disposed to execute a plurality of application programs. In an embodiment, the processing circuit 110 can execute such as, but not limited to a driver program DRI of the audio processing chip mentioned above to operate the modules of the audio processing chip. Further, the processing circuit 110 can execute the application programs related to the audio to perform audio processing.

The processing circuit 110 may execute a first audio application program APP1 and identifies that a first analog input audio stream ANA1 corresponding to the first audio application program APP1 is from an audio source 112A.

In an embodiment, the first audio application program APP1 can be such as, but not limited to voice recognition and control software or recording software. The audio source 112A can be such as, but not limited to a microphone to receive the first analog input audio stream ANA1.

In an embodiment, the voice recognition and control software can be such as, but not limited to background program that is kept in operation and can receive the first analog input audio stream ANA1 through the microphone to keep identifying whether there is a voice control command within the first analog input audio stream ANA1. In an embodiment, the processing circuit 110 further executes voice recognition and control software to perform corresponding operations according to the voice control command within the first analog input audio stream ANA1.

In an embodiment, the processing circuit 110 writes assigning information in the register 104 to assign the first analog input audio stream ANA1 to the first ADC 100.

In an embodiment, when the processing circuit 110 executes the first audio application program APP1, the processing circuit 110 can execute a second audio application program APP2 different from the first audio application program APP1 at the same time. In an embodiment, the second audio application program APP2 can be such as, but not limited to recording software. The recording software is in operation according to such as, but not limited to the input of the user performed on the computer system.

The processing circuit 110 identifies whether the second audio application program APP2 also corresponds to the first analog input audio stream ANA1 as the first audio application program APP1 does.

When the processing circuit 110 identifies that the second audio application program APP2 and the first audio application program APP1 both correspond to the first analog input audio stream ANA1, the processing circuit 110 controls the first ADC 100 to process the first analog input audio stream ANA1. More specifically but not limited thereto, the processing circuit 110 writes share information INFO to the register 104 such that the first ADC 100 reads the share information INFO. By such, the first ADC 100 is informed that both the first audio application program APP1 and the second audio application program APP2 receive the first analog input audio stream ANA1 from the same audio source 112A.

As a result, after the first ADC 100 reads the assigning information (not illustrated) and the share information INFO in the register 104, the first ADC 100 processes and converts the first analog input audio stream ANA1 to a first digital audio stream DIG1 and a second digital audio stream DIG2. Further, the first ADC 100 transmits the first digital audio stream DIG1 to the first accessing module 106 and the first digital audio stream DIG1 is stored therein. The first ADC 100 transmits the second digital audio stream DIG2 to the second accessing module 108 and the second digital audio stream DIG2 is stored therein.

When the processing circuit 110 identifies that the second audio application program APP2 corresponds to a second analog input audio stream ANA2 that is not generated from the audio source 112A but from another audio source 112B, the processing circuit 110 writes another assigning information in the register 104 to assign the second analog input audio stream ANA2 to the second ADC 102 such that the second ADC 102 processes the second analog input audio stream ANA2. In an embodiment, the audio source 112B can receive the second analog input audio stream ANA2 through such as, but not limited to a line-in port from an external electronic device.

As illustrated in FIG. 1B, after the second ADC 102 reads the assigning information in the register 104, the second ADC 102 processes and converts the second analog input audio stream ANA2 to the second digital audio stream DIG2. The second ADC 102 transmits the second digital audio stream DIG2 to the second accessing module 108 and stores the second digital audio stream DIG2 therein.

Based on the above description, when both the second audio application program APP2 and the first audio application program APP1 correspond to the first analog input audio stream ANA1, the audio processing device 1 does not need to use two ADCs. The audio processing device 1 only needs to use the first ADC 100 to process the first analog input audio stream ANA1. As a result, for the audio processing device 1, the hardware required for performing such analog-to-digital conversion can be reduced.

It is appreciated that in the above embodiments, the objects that the audio source 112A and the audio source 112B receive the analog input audio stream from are merely an example. In other embodiments, the audio source 112A and the audio source 112B can receive the analog input audio stream from other devices.

Figure 2:
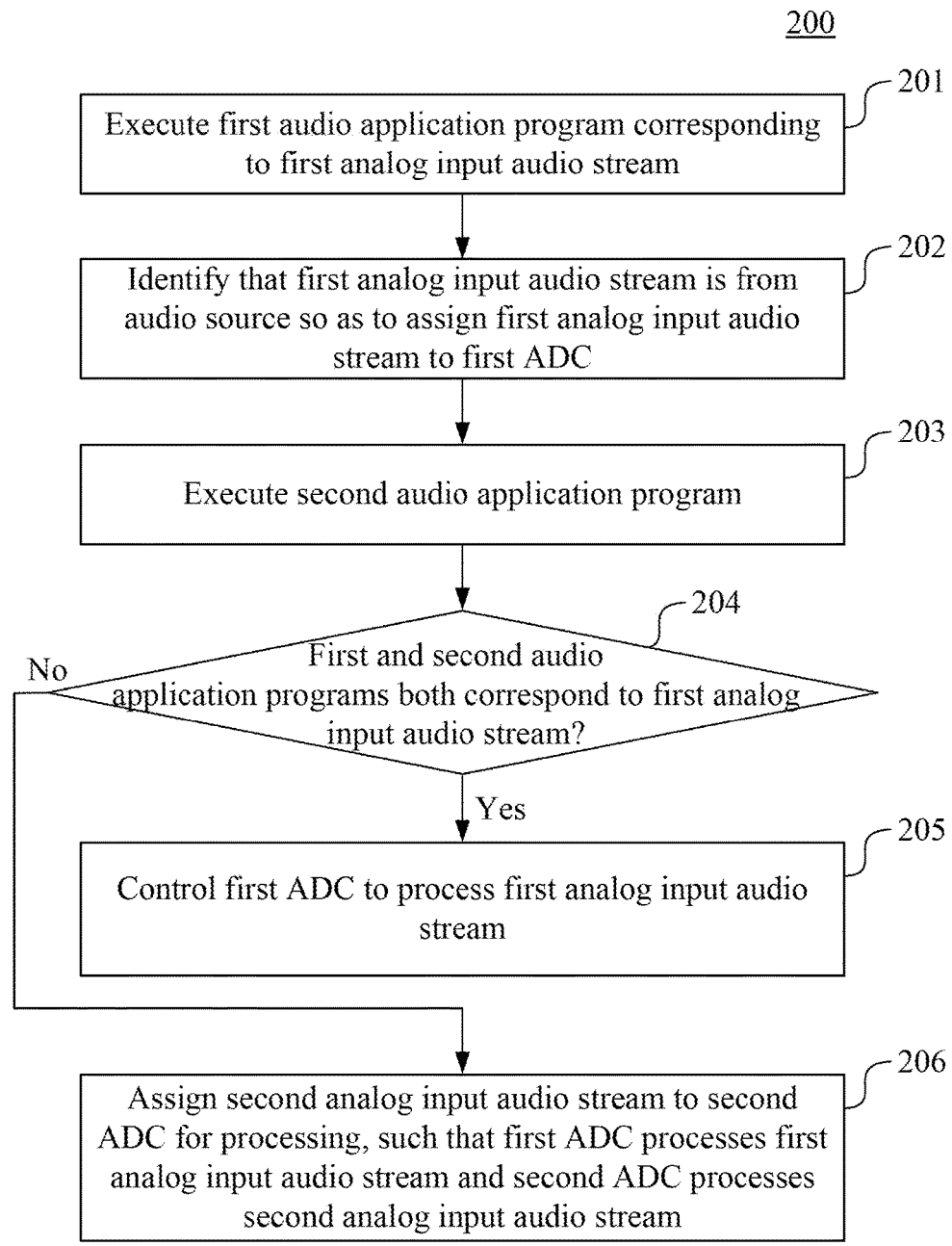
FIG. 2 is a flow chart of an audio processing method in an embodiment of the present invention.

Reference is now made to FIG. 2. FIG. 2 is a flow chart of an audio processing method 200 in an embodiment of the present invention. The audio processing method 200 can be used in the audio processing device 1 illustrated in FIG. 1A and FIG. 1B. In an embodiment, the processing circuit 110 in the audio processing device 1 may execute the driver program DRI of the audio processing chip to perform the audio processing method 200. The audio processing method 200 includes the steps outlined below.

In step 201, the processing circuit 110 executes the first audio application program APP1 corresponding to the first analog input audio stream ANA1.

In step 202, the processing circuit 110 identifies that the first analog input audio stream ANA1 is from the audio source 112A so as to assign the first analog input audio stream ANA1 to the first ADC 100.

In step 203, the processing circuit 110 executes the second audio application program APP2.

In step 204, the processing circuit 110 identifies whether the second audio application program APP2 also corresponds to the first analog input audio stream ANA1 as the first audio application program APP1 does.

When both the first audio application program APP1 and the second audio application program APP2 correspond to the first analog input audio stream ANA1, the flow goes to step 205. The processing circuit 110 controls the first ADC 100 to process the first analog input audio stream ANA1. More specifically but not limited thereto, the processing circuit 110 writes share information INFO to the register 104 such that the first ADC 100 reads the share information INFO in the register 104 and processes the first analog input audio stream ANA1.

When the second audio application program APP2 corresponds to the second analog input audio stream ANA2 that is not generated from the audio source 112A, the flow goes to step 206. The processing circuit 110 assigns the second analog input audio stream ANA2 to the second ADC 102 for processing, such that the first ADC 100 processes the first analog input audio stream ANA1 and the second ADC 102 processes the second analog input audio stream ANA2.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An audio processing device comprising:
   a first analog-to-digital converter (ADC);
   a second ADC;
   a register; and
   a processing circuit configured to execute a first audio application program corresponding to a first analog input audio stream, configured to identify that the first analog input audio stream is from an audio source and configured to assign the first analog input audio stream to the first ADC;
   wherein when the processing circuit executes a second audio application program and identifies that the second audio application program also corresponds to the first analog input audio stream, the processing circuit is configured to control the first ADC to process the first analog input audio stream that corresponds to both the second audio application program and the first audio application program; and
   when the second audio application program corresponds to a second analog input audio stream that is not generated from the audio source, the processing circuit is configured to assign the second analog input audio stream to the second ADC for processing, such that the first ADC processes the first analog input audio stream and the second ADC processes the second analog input audio stream.

2. The audio processing device of claim 1, wherein each of the first audio application program and the second audio application program is voice recognition and control software or recording software.

3. The audio processing device of claim 1, wherein the first ADC and the second ADC are disposed in a coder-decoder (CODEC) unit.

4. The audio processing device of claim 1, further comprising a first accessing module and a second accessing module, wherein the processing circuit is further configured to transmit a first digital audio stream to the first accessing module, wherein the first digital audio stream is generated by the first ADC according to the first analog input audio stream;
   wherein when the second analog input audio stream is from the same audio source, the first ADC transmits a second digital audio stream generated according to the second analog input audio stream to the second accessing module; and
   when the second analog input audio stream is not from the same audio source, the second ADC transmits the second digital audio stream generated according to the second analog input audio stream to the second accessing module.

5. The audio processing device of claim 4, wherein the first accessing module and the second accessing module are disposed in an audio controller.

6. The audio processing device of claim 4, wherein each of the first accessing module and the second accessing module is a direct memory access (DMA) module.

7. The audio processing device of claim 1, wherein when the processing circuit identifies that the second audio application program also corresponds to the first analog input audio stream, the processing circuit is further configured to write share information to a register such that the first ADC reads the share information and processes the first analog input audio stream.

8. An audio processing method used in an audio processing device comprising:
   executing a first audio application program corresponding to a first analog input audio stream by a processing circuit, identifying that the first analog input audio stream is from an audio source by a processing circuit and assigning the first analog input audio stream to a first ADC;
   executing a second audio application program and identifying whether the second audio application program also corresponds to the first analog input audio stream by the processing circuit;
   when the second audio application program also corresponds to the first analog input audio stream, controlling the first ADC to process the first analog input audio stream that corresponds to both the second audio application program and the first audio application program; and
   when the second audio application program corresponds to a second analog input audio stream that is not generated from the audio source, assigning the second analog input audio stream to the second ADC for processing by the processing circuit, such that the first ADC processes the first analog input audio stream and the second ADC processes the second analog input audio stream.

9. The audio processing method of claim 8, wherein each of the first audio application program and the second audio application program is voice recognition and control software or recording software.

10. The audio processing method of claim 8, wherein the first ADC and the second ADC are disposed in a CODEC unit.

11. The audio processing method of claim 8, further comprising:
    transmitting a first digital audio stream to a first accessing module by the processing circuit, wherein the first digital audio stream is generated by the first ADC according to the first analog input audio stream;
    when the second analog input audio stream is from the same audio source, transmitting a second digital audio stream generated according to the second analog input audio stream to a second accessing module by the first ADC; and
    when the second analog input audio stream is not from the same audio source, transmitting the second digital audio stream generated according to the second analog input audio stream to the second accessing module by the second ADC.

12. The audio processing method of claim 11, wherein the first accessing module and the second accessing module are disposed in an audio controller.

13. The audio processing method of claim 11, wherein each of the first accessing module and the second accessing module is a DMA module.

14. The audio processing method of claim 8, wherein when the second audio application program is identified to correspond to the first analog input audio stream, the method further comprises:
    writing share information to a register such that the first ADC reads the share information and processes the first analog input audio stream.

\* \* \* \* \*